US009449895B2

(12) United States Patent
Yoo et al.

(10) Patent No.: US 9,449,895 B2
(45) Date of Patent: Sep. 20, 2016

(54) COOLING SYSTEM FOR MOLDED MODULES AND CORRESPONDING MANUFACTURING METHODS

(71) Applicant: Infineon Technologies AG, Neubiberg (DE)

(72) Inventors: Inpil Yoo, Unterhaching (DE); Carlos Castro Serrato, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 13/886,375

(22) Filed: May 3, 2013

(65) Prior Publication Data

US 2014/0327128 A1  Nov. 6, 2014

(51) Int. Cl.

| | |
|---|---|
| *H01L 23/46* | (2006.01) |
| *H01L 23/28* | (2006.01) |
| *H01L 23/29* | (2006.01) |
| *H01L 23/44* | (2006.01) |
| *H01L 21/48* | (2006.01) |
| *H01L 23/473* | (2006.01) |
| *H01L 23/31* | (2006.01) |
| *H01L 21/56* | (2006.01) |

(52) U.S. Cl.
CPC ........... *H01L 23/44* (2013.01); *H01L 21/4803* (2013.01); *H01L 21/4882* (2013.01); *H01L 21/565* (2013.01); *H01L 23/28* (2013.01); *H01L 23/29* (2013.01); *H01L 23/3107* (2013.01); *H01L 23/473* (2013.01); *H01L 2924/0002* (2013.01)

(58) Field of Classification Search
CPC ..... H01L 23/44; H01L 23/46; H01L 23/473; H01L 21/48; H05K 7/20236
USPC .......................... 257/713, 714; 438/125, 126
See application file for complete search history.

(56) References Cited

U.S. PATENT DOCUMENTS

| | | | | |
|---|---|---|---|---|
| 5,270,571 A | * | 12/1993 | Parks et al. .................. | 257/686 |
| 5,350,713 A | * | 9/1994 | Liang ............................ | 438/106 |
| 6,052,284 A | * | 4/2000 | Suga et al. .................... | 361/699 |
| 7,285,851 B1 | * | 10/2007 | Cepeda-Rizo et al. ....... | 257/712 |
| 2006/0002086 A1 | * | 1/2006 | Teneketges et al. .......... | 361/699 |

(Continued)

FOREIGN PATENT DOCUMENTS

| | | |
|---|---|---|
| DE | 102014106134 A1 | 11/2014 |
| EP | 0709884 A2 | 5/1996 |

(Continued)

*Primary Examiner* — Thao X Le
*Assistant Examiner* — J. R. Oakley
(74) *Attorney, Agent, or Firm* — Murphy, Bilak & Homiller, PLLC

(57) ABSTRACT

A cooling system for molded modules includes a plurality of individual modules each including a semiconductor die encapsulated by a mold compound, a plurality of leads electrically connected to the semiconductor die and at least partly uncovered by the mold compound, and a cooling plate at least partly uncovered by the mold compound. A molded body surrounds a periphery of each individual module to form a multi-die module. The leads of each individual module and the cooling plates are at least partly uncovered by the molded body. A lid with a port is attached to a periphery of the molded body at a first side of the multi-die module. The lid seals the multi-die module at the first side to form a cavity between the lid and the molded body for permitting fluid exiting or entering the port to contact the cooling plates of each individual module.

21 Claims, 8 Drawing Sheets

(56) References Cited

U.S. PATENT DOCUMENTS

| | | | |
|---|---|---|---|
| 2008/0160246 A1* | 7/2008 | Buhler et al. | 428/99 |
| 2008/0239671 A1* | 10/2008 | Amano et al. | 361/699 |
| 2008/0272485 A1 | 11/2008 | Myers et al. | |
| 2009/0057882 A1* | 3/2009 | Gerbsch | 257/714 |
| 2009/0101316 A1* | 4/2009 | Han | 165/104.33 |
| 2009/0146293 A1* | 6/2009 | Olesen | 257/714 |
| 2011/0122583 A1* | 5/2011 | Lowry | 361/699 |
| 2011/0164385 A1* | 7/2011 | Hou | F28F 3/048 361/699 |
| 2011/0299244 A1 | 12/2011 | Dede et al. | |
| 2012/0152498 A1* | 6/2012 | Lyon | 165/104.31 |
| 2012/0257354 A1 | 10/2012 | Dede | |
| 2013/0146253 A1* | 6/2013 | Daly | H05K 7/20281 165/80.4 |
| 2013/0154081 A1 | 6/2013 | Kadoguchi et al. | |
| 2013/0258592 A1* | 10/2013 | Brandenburg et al. | 361/699 |
| 2013/0341782 A1* | 12/2013 | Kim et al. | 257/706 |
| 2013/0343001 A1 | 12/2013 | Kwak et al. | |
| 2014/0327128 A1 | 11/2014 | Yoo et al. | |

FOREIGN PATENT DOCUMENTS

| | | |
|---|---|---|
| EP | 1965424 A2 | 9/2008 |
| EP | 2034521 A2 | 3/2009 |
| EP | 2164100 A2 | 3/2010 |
| EP | 2325880 A2 | 5/2011 |
| EP | 2645839 A2 | 10/2013 |
| EP | 2734020 A1 | 5/2014 |
| JP | 2012004359 A | 1/2012 |

* cited by examiner

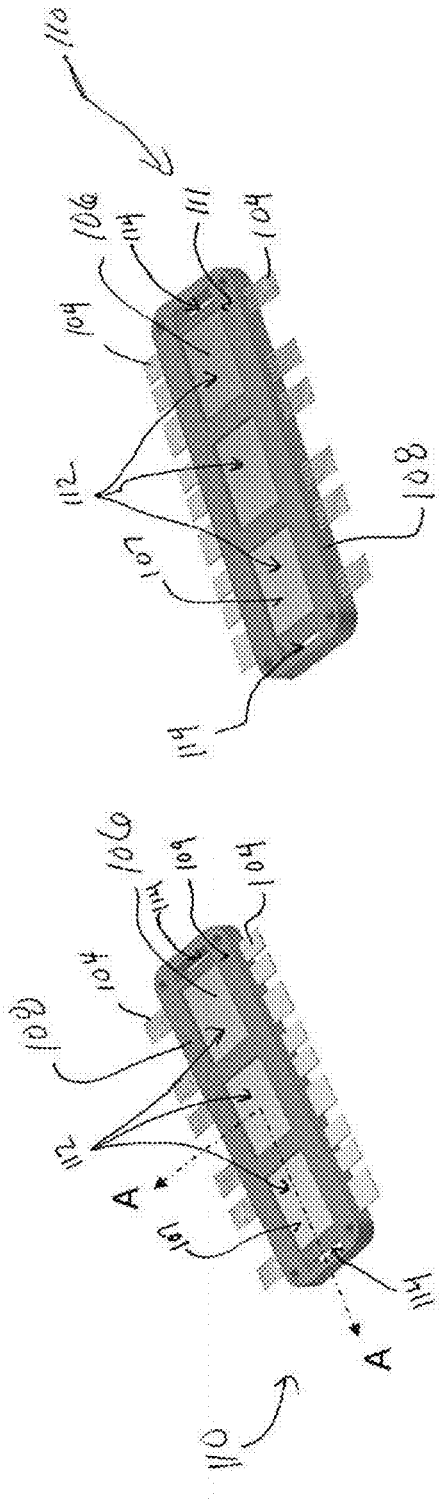
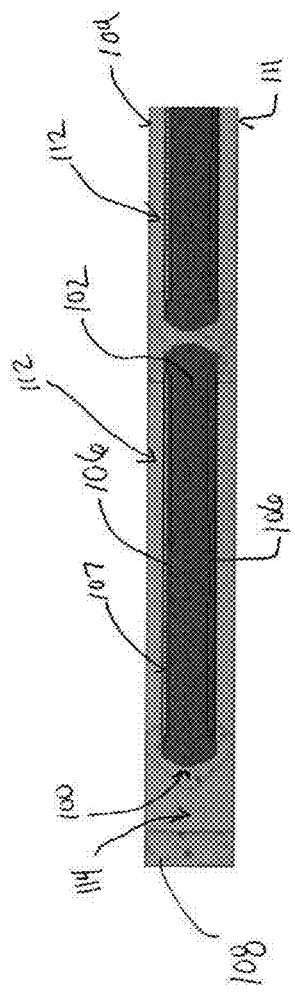
Figure 2A
Figure 2B
Figure 2C ns and corresponding manufacturing methods

TECHNICAL FIELD

The instant application relates to power modules, and more particularly to cooling systems for power modules.

BACKGROUND

Power modules with double-side cooling significantly improve the thermal performance of the package by reducing thermal resistance, and thereby increasing the power density of the entire system. However, power modules with double-sided cooling present a challenge with regard to integrating a heat-sink with the module. The design of the cooler often is a critical issue in achieving the highest possible performance. For example, the cooling fluid should be distributed in two different channels above and below the power modules included in the package to increase the thermal performance of the package. Also, the entire system must be watertight. The heat sink should be robust, low-cost and lightweight.

Conventional double-sided module cooling technologies require additional parts such as O-rings and bolts or screws to achieve a water-tight system. Conventional aluminum coolers also use thicker aluminum blocks. Still further components are typically needed to achieve a watertight heat-sink and bi-directional coolant distribution. These additional parts increase the system weight and cost and still present a real risk of fluid leakage. Furthermore, the need for many assembly steps increases production cost.

SUMMARY

Embodiments described herein provide a plastic molded cooling system without bolt connections and O-rings. The cooling system has a much lower risk of fluid leakage and higher design flexibility compared to conventional power module cooling systems, significantly reducing system cost, the number of assembly steps and system weight.

According to an embodiment of a cooling system for molded modules, the cooling system comprises a plurality of individual modules each comprising a semiconductor die encapsulated by a mold compound, a plurality of leads electrically connected to the semiconductor die and at least partly uncovered by the mold compound, and a cooling plate at least partly uncovered by the mold compound. The cooling system further comprises a molded body surrounding a periphery of each individual module to form a multi-die module. The leads of each individual module and the cooling plates are at least partly uncovered by the molded body. A lid with a port is attached to a periphery of the molded body at a first side of the multi-die module. The lid seals the multi-die module at the first side to form a cavity between the lid and the molded body for permitting fluid exiting or entering the port to contact the cooling plates of each individual module.

According to an embodiment of a method of manufacturing a cooling system for molded modules, the method comprises: providing a plurality of individual modules each comprising a semiconductor die encapsulated by a mold compound, a plurality of leads electrically connected to the semiconductor die and at least partly uncovered by the mold compound, and a cooling plate at least partly uncovered by the mold compound; forming a molded body surrounding a periphery of each individual module to form a multi-die module with the leads of each individual module and the cooling plates being at least partly uncovered by the molded body; and attaching a lid with a port to a periphery of the molded body at a first side of the multi-die module, the lid sealing the multi-die module at the first side to form a cavity between the lid and the molded body for permitting fluid exiting or entering the port to contact the cooling plates of each individual module.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 1 through 3, including FIGS. 2A through 2C and 3A and 3B, illustrate different steps of an embodiment of a method of manufacturing a cooling system for molded modules;

DETAILED DESCRIPTION

According to embodiments described herein, a cooling system for molded modules is provided. The cooling system comprises a plurality of individual modules. Each module comprises a semiconductor die encapsulated by a mold compound, a plurality of leads electrically connected to the semiconductor die and at least partly uncovered by the mold compound, and a cooling plate at least partly uncovered by the mold compound. The cooling system further comprises a molded body surrounding a periphery of each individual module to form a multi-die module. The leads of each individual module and the cooling plates are at least partly uncovered by the molded body. A lid with a port is attached to the periphery of the molded body at a first side of the multi-die module. The lid seals the multi-die module at the first side to form a cavity between the lid and the molded body for permitting fluid exiting or entering the port to contact the cooling plates of each individual module. The cooling system does not require bolt connections or O-rings. As such, the cooling system has a much lower risk of fluid leakage and higher design flexibility compared to conventional power module cooling systems, significantly reducing system cost, the number of assembly steps and system weight.

Figure 1:
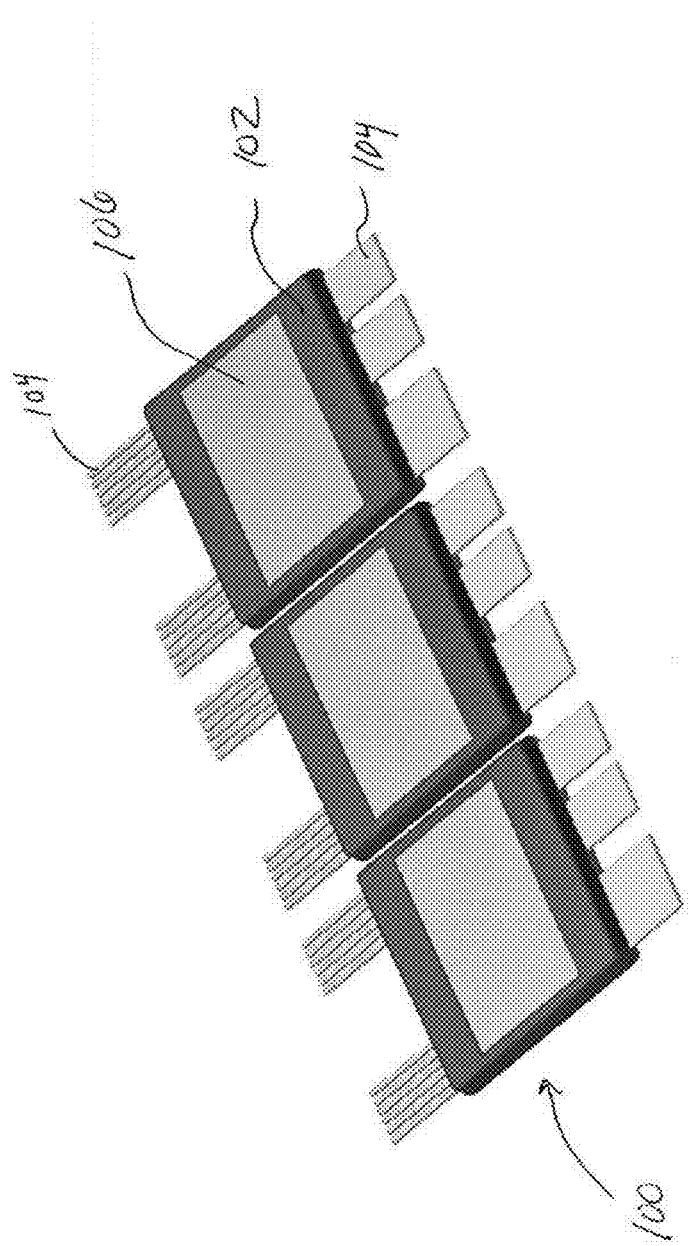

FIGS. 1 through 3 illustrate an embodiment of method of manufacturing the cooling system. According to this embodiment, a plurality of individual modules 100 is provided as shown in FIG. 1. The modules 100 can be purchased or manufactured. In either case, each module 100 comprises a semiconductor die encapsulated by a mold compound 102 such as an epoxy, a plurality of leads 104 electrically connected to the semiconductor die and at least partly uncovered by the mold compound 102, and a cooling plate 106 at least partly uncovered by the mold compound 102. The leads 104 provide the necessary electrical connections to the semiconductor die. The leads 104 can be of the lead-frame type which protrude out from the mold compound 102 of the modules 100 as shown in FIG. 1. Other types of leads 104 can be used such as the kind used in surface-mount modules, e.g. gull-wing, J-lead or flat leads.

The semiconductor die included in the individual modules 100 and connected to the leads 104 can be any type of semiconductor die requiring liquid cooling during operation such as an IGBT (insulated gate bipolar transistor) die, power MOSFET (metal oxide semiconductor field effect transistor) die, JFET (junction field effect transistor) die, GaN die, SiC die, thyristor die, power diode die, etc. More than one semiconductor die can be included in some or all of the modules 100, as well as passive components. The semiconductor dies can form any type of desired circuit such as a half-bridge, full-bridge or 3-phase circuit, etc.

Each individual module 100 can have a single cooling plate 106 at one side of the module 100, or a pair of spaced apart cooling plates 106 at opposing sides of the module 100 with the corresponding semiconductor die interposed between the pair of cooling plates 106 (the bottom module cooling plates are out of view in FIG. 1). In either case, the module cooling plates 106 remain at least partly uncovered by the mold compound 102 of the corresponding module 100.

Continuing with the manufacturing process, a molded body 108 is formed, e.g. by injection molding which surrounds the periphery of each individual module 100 to form a multi-die module 110. FIG. 2A shows the top side 109 of the multi-die module 110 and FIG. 2B shows the bottom side 111. FIG. 2C shows an enlarged partial cross-sectional view of the multi-die module 110 along the line labeled A-A in FIG. 2A. The individual modules 100 included in the multi-die module 110 each have a pair of spaced apart cooling plates 106 according to this embodiment, as previously described herein. The cooling plates 106 at the top side 109 of the multi-die module 110 and the cooling plates 106 at the bottom side 111 of the multi-die module 110 remain at least partly uncovered by the molded body 108. The leads 104 of each individual module 100 also remain at least partly uncovered by the molded body 108. In the case of lead-frame type or similar leads, the leads 104 of each individual module 100 protrude out of the molded body 108 as shown in FIGS. 2A and 2B. A different module lead configuration is possible with other types of module leads 104 such as surface-mount leads. In each case, electrical connections can be made to the individual modules 100 and the individual modules 100 can be directly cooled at the exposed side 107 of the cooling plates 106.

In one embodiment, the molded body 108 has open recessed regions 112 over the cooling plates 106 so that the cooling plates 106 remain at least partly uncovered by the molded body 108. The molded body 108 can have open passageways 114 at opposing ends of the molded body 108. Such a multi-die module construction permits a fluid to flow in direct contact with the cooling plates 106 at both sides 109, 111 of the multi-die module 110 as described in more detail later herein.

Figure 3B:
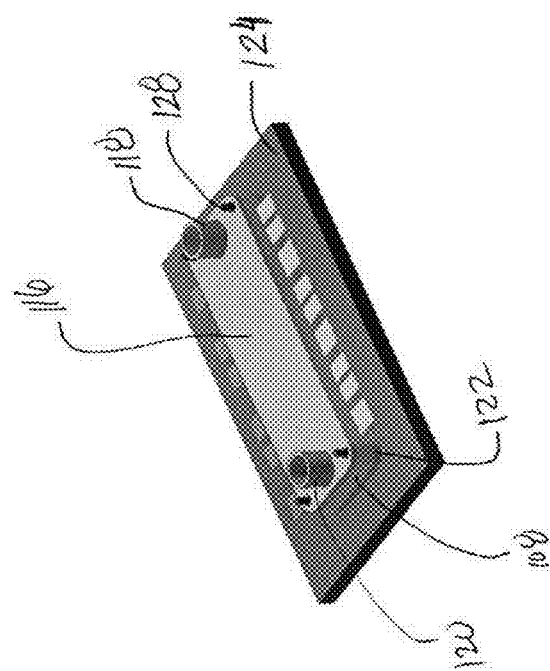
Figure 3A:
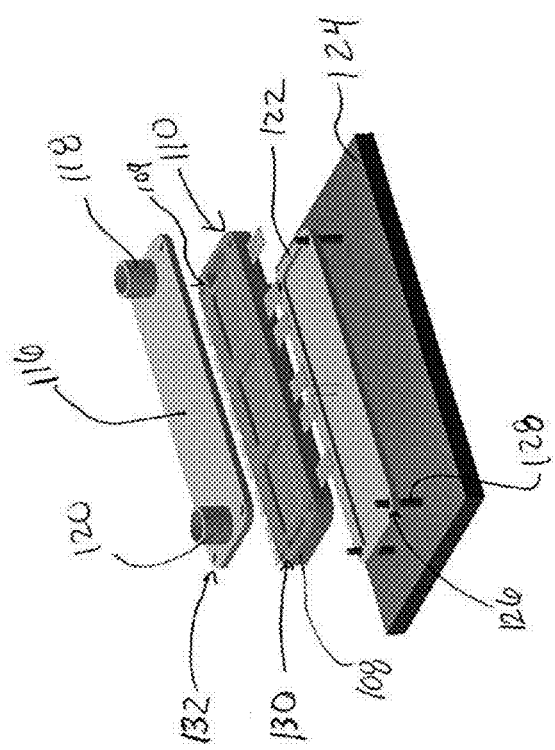

A lid 116 with at least one port 118, 120 is then attached to the periphery of the molded body 108 at a first (e.g. top) side 109 of the multi-die module 110. FIG. 3A shows the cooling system during the lid attach process, and FIG. 3B shows the cooling system after the lid 116 is attached to the periphery of the molded body 108. The lid 116 seals the multi-die module 110 at the first side 109 to form a cavity (out of view in FIGS. 3A and 3B) between the lid 116 and the molded body 108. The cavity permits fluid exiting or entering one of the ports 118, 120 in the lid 116 to contact the cooling plates 106 of each individual module 100 included in the multi-die module 110. A base plate 122 is attached to the periphery of the molded plastic body 108 at the second (e.g. bottom) side 111 of the multi-die module 110. The base plate 122 seals the multi-die module 110 at the second side 111 of the multi-die module 110.

In one embodiment, the lid 116 and the base plate 122 each comprise plastic. According to this embodiment, the lid 116 and base plate 122 are attached to the periphery of the molded body 108 at opposing main sides 109, 111 of the multi-die module 110 by positioning the base plate 122 on a support base 124 such as a jig so that openings 126 in the base plate 122 align with corresponding posts 128 of the support base 124. The molded body 108 is positioned on the base plate 122 so that openings 130 in the molded body 108 align with the posts 128 of the support base 124, and the lid 116 is positioned on the molded body 108 so that openings 132 in the lid 116 align with the posts 128 of the support base 124. The lid 116 is then plastic welded to the periphery of the molded body 108 at the first side 109 of the multi-die module 110, and the base plate 122 is plastic welded to the periphery of the molded body 108 at the second (opposing) side 111 of the multi-die module 110.

In another embodiment, the lid 116 and base plate 122 are attached to the periphery of the molded body 108 at opposing sides 109, 111 of the multi-die module 110 by over-molding. Over-molding is an injection molding process where two materials are molded together. The lid 116 and base plate 122 can be plastic or another material such as metal (e.g. aluminum) according to this embodiment. In each case, the over-molded lid 116 and base plate 122 seal the multi-die module 100 at the opposing main sides 109, 111 of the multi-die module 110 and form the coolant cavity between the molded body 108 and the lid 116 and base plate 122. In yet another embodiment, the lid 116 and base plate 122 are attached to the periphery of the molded body 108 at the opposing sides 109, 111 of the multi-die module 110 by gluing, e.g. using an adhesive.

Figure 4B:
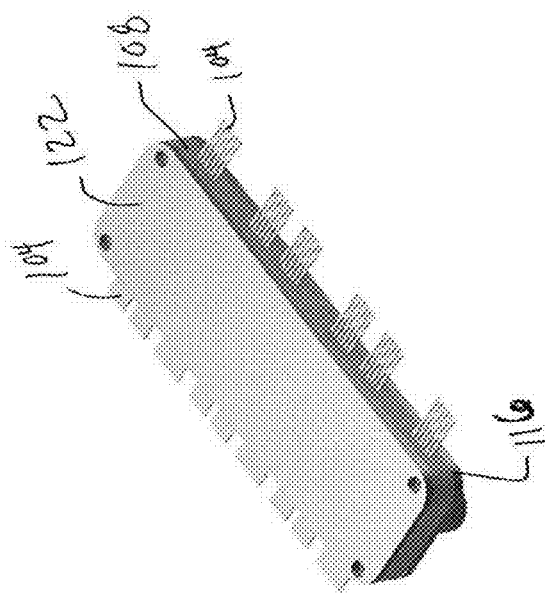
FIGS. 4A through 4E illustrate different views of a cooling system for molded modules according to an embodiment.
Figure 4A:
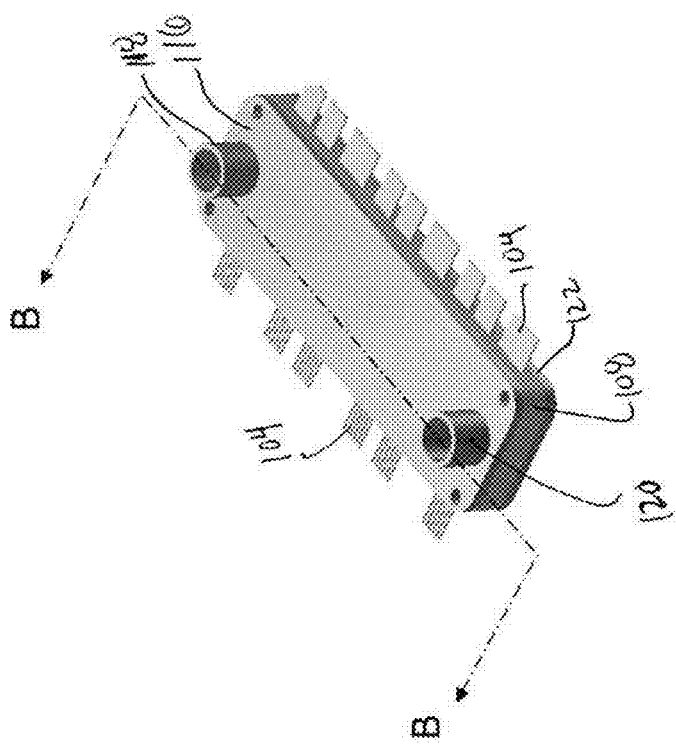
Figure 4C:
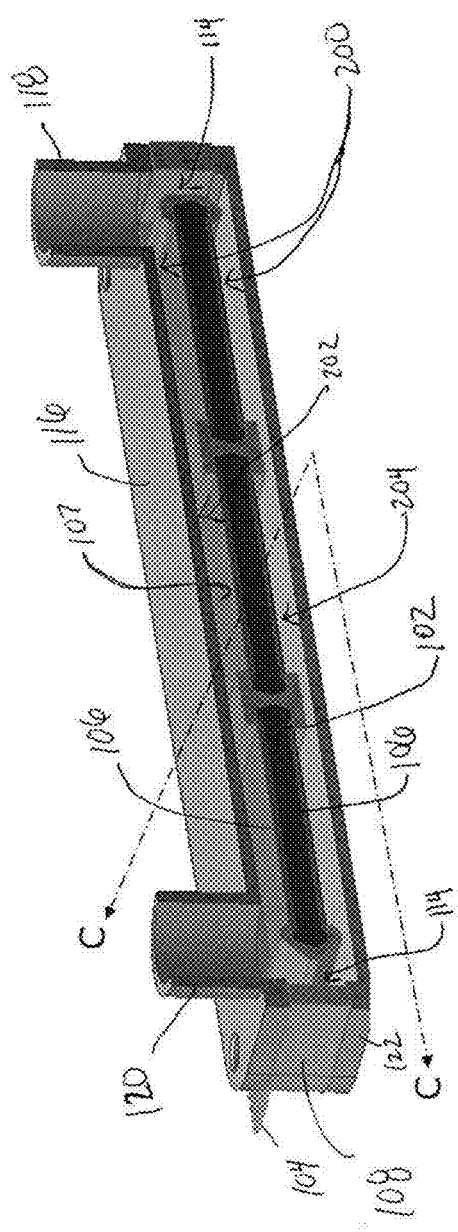
Figure 4D:
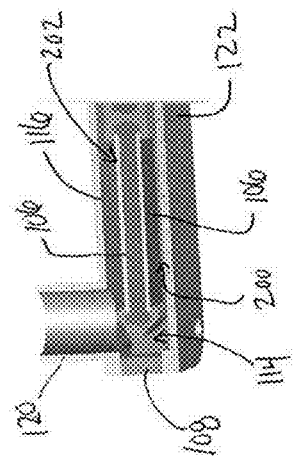
Figure 4E:
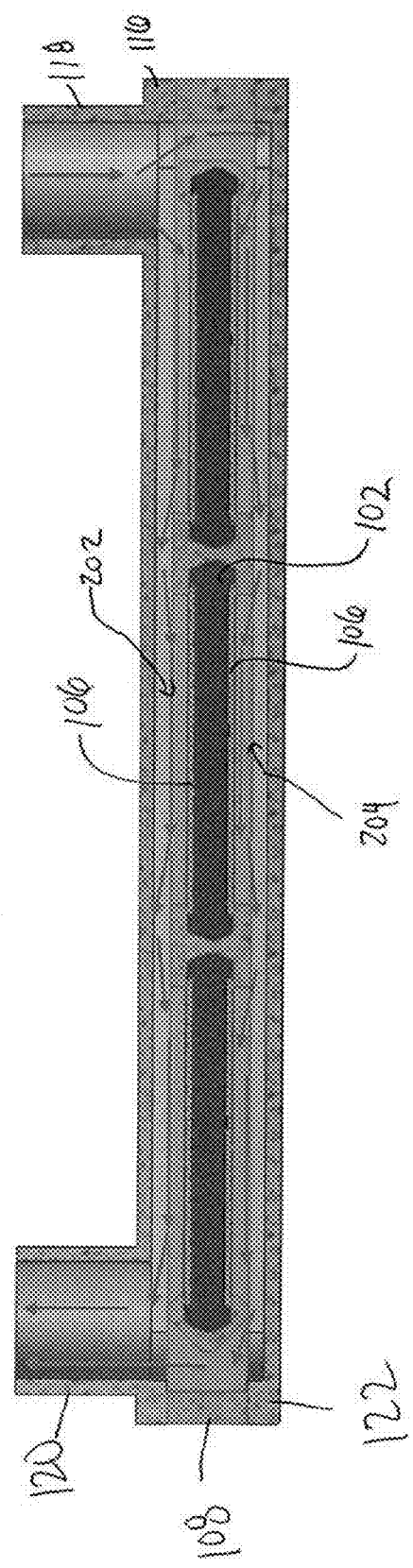

FIGS. 4A through 4E show different views of the cooling system after manufacturing. FIG. 4A shows the top side of the cooling system. FIG. 4B shows the bottom side of the cooling system. FIG. 4C shows a cross-sectional view of the cooling system along the line labeled B-B in FIG. 4A. FIG. 4D shows an enlarged partial cross-sectional view of the cooling system along the line labeled C-C in FIG. 4C. FIG. 4E shows a cross-sectional view of the cooling system along the line labeled B-B in FIG. 4A with fluid flowing in the cavity of the cooling system.

The cooling system includes the individual modules 100, the molded body 108 surrounding the periphery of each individual module 100 to form a multi-die module 110 (with the leads 104 of each individual module 100 and the cooling plates 106 being at least partly uncovered by the molded body 108), and the lid 116 attached to the periphery of the molded body 108 at a first (e.g. top) side 109 of the multi-die module 110 and the base plate 122 attached to the periphery of the molded plastic body 108 at the opposing (e.g. bottom) side 111 of the multi-die module 110. The lid 116 seals the multi-die module 110 at the first side 109 and the base plate 122 seals the multi-die module 110 at the opposing side 111. Upon attachment to the molded body 108, the lid 116 and the base plate 122 form a cavity 200 between the molded body 108 and the lid 116 and base plate 122. The cavity 200 permits fluid exiting or entering one of the ports 118, 120 in the lid 116 to contact the cooling plates 106 of each individual module 100.

The cavity 200 has a first part 202 between the lid 116 and the molded body 108 and a second part 204 between the base plate 122 and the molded body 108 according to the double-sided cooling embodiment illustrated in FIGS. 4A through 4E. According to this embodiment, the molded body 108 has an open passageway 114 at opposing ends of the molded body 108 which connect the first and second parts 202, 204 of the cavity 200. This way, fluid can circulate in contact with the cooling plates 106 at both the top and bottom sides 109, 111 of the multi-die module 110. The lid 116 has an inlet port 118 for in-taking fluid into the first and second parts 202, 204 of the cavity 200 in parallel and an outlet port 120 at the same side as the inlet port 120 for exhausting the fluid from the first and second parts 202, 204 of the cavity 200 in parallel. The parallel fluid flow path is illustrated in FIG. 4E with arrows. The cooling plates 106 can have surface structures such as pins, fins or an intentionally roughened surface at a side 107 of the cooling plates 106 open to the cavity 200 for increasing the turbulence of the fluid flowing in the cavity over the cooling plates 106.

Figure 5A:
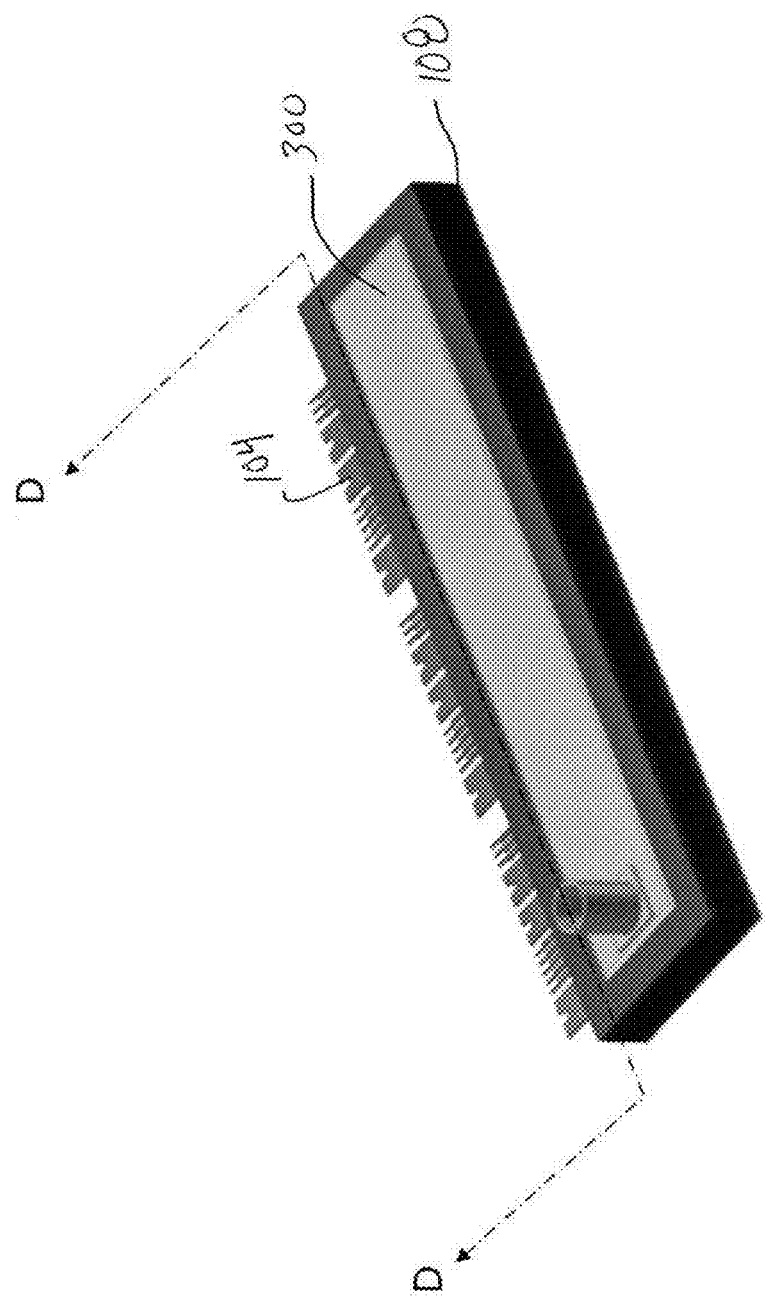
FIGS. 5A and 5B illustrate different views of a cooling system for molded modules according to another embodiment.
Figure 5B:
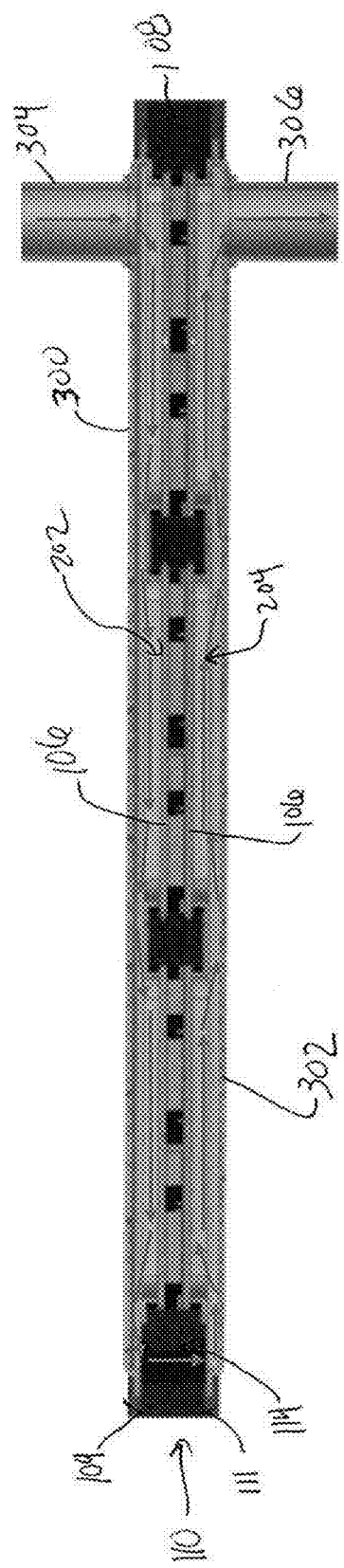

FIGS. 5A and 5B show different views of the cooling system according to another embodiment. FIG. 5A shows a perspective view of the cooling system, and FIG. 5B shows a cross-sectional view of the cooling system along the line labeled D-D in FIG. 5A. According to this embodiment, the cooling system includes a first lid 300 attached to the periphery of the molded plastic body 108 at a first (e.g. top) side 109 of the multi-die module 110 and a second lid 302 attached to the periphery of the molded plastic body 108 at the opposing (e.g. bottom) side 111 of the multi-die module 110. The lids 300, 302 collectively seal the multi-die module 110 at the opposing main sides 109, 111 of the multi-die module 110. Both lids 300, 302 have a port 304, 306. For example, the port 304 in the first lid 300 can be the inlet port and the port 306 in the second lid 302 can be the outlet port or vice-versa. The inlet port 304 intakes a fluid into the first and second parts 202, 204 of the cavity 200 in series. The outlet port 306 likewise exhausts the fluid from the first and second parts 202, 204 of the cavity 200 in series. The series fluid flow path is illustrated in FIG. 5B with arrows. According to this embodiment, the molded body 108 has an open passageway 114 at only one end of the molded body 108 to ensure a series fluid flow.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A cooling system for molded modules, comprising:
a plurality of individual modules each comprising a semiconductor die encapsulated by a mold compound, a plurality of leads electrically connected to the semiconductor die and at least partly uncovered by the mold compound, and a cooling plate at least partly uncovered by the mold compound;
a plastic body molded onto a periphery of each individual module so as to form a multi-die module having a molded connection between the plastic body and the periphery of the individual modules without bolt or screw connections, with the leads of each individual module and the cooling plates being at least partly uncovered by the plastic body, wherein a portion of the plastic body occupies at least a portion of a gap between two adjacent ones of the individual modules; and
a lid with a port attached to a periphery of the plastic body at a first side of the multi-die module,
wherein a direct seal is formed between the lid and the multi-die module at the first side without O-rings so as to form a cavity between the lid and the plastic body for permitting fluid exiting or entering the port to contact the cooling plates of each individual module.

2. The cooling system of claim 1, wherein each individual module has a pair of spaced apart cooling plates at opposing sides of the individual module with the semiconductor die interposed between the pair of cooling plates, wherein each pair of cooling plates is at least partly uncovered by the plastic body at opposing first and second sides of the multi-die module, and wherein each pair of cooling plates is open to the cavity.

3. The cooling system of claim 2, further comprising a base plate attached to the periphery of the plastic body at the second side of the multi-die module, the base plate sealing the multi-die module at the second side of the multi-die module.

4. The cooling system of claim 3, wherein the cavity comprises a first part between the lid and the plastic body and a second part between the base plate and the plastic body, and wherein the plastic body has an open passageway at opposing ends of the plastic body which connect the first and second parts of the cavity.

5. The cooling system of claim 4, wherein the port of the lid is an inlet port configured to intake a fluid into the first and second parts of the cavity in parallel, and wherein the lid further has an outlet port at the same side as the inlet port configured to exhaust the fluid from the first and second parts of the cavity in parallel.

6. The cooling system of claim 2, further comprising an additional lid attached to the periphery of the plastic body at the second side of the multi-die module, the additional lid sealing the multi-die module at the second side of the multi-die module, wherein the port of the lid is configured to intake a fluid into the cavity, and wherein the additional lid has an outlet port configured to exhaust the fluid from the cavity.

7. The cooling system of claim 1, wherein the leads of each individual module protrude out of the plastic body.

8. The cooling system of claim 1, wherein the lid comprises plastic and is plastic welded to the periphery of the plastic body to seal the multi-die module at the first side of the multi-die module and form the cavity between the lid and the plastic body.

9. The cooling system of claim 1, wherein the lid is over-molded to the periphery of the plastic body to seal the multi-die module at the first side of the multi-die module and form the cavity between the lid and the plastic body.

10. The cooling system of claim 1, wherein the lid is attached to the periphery of the plastic body by an adhesive to seal the multi-die module at the first side of the multi-die module and form the cavity between the lid and the plastic body.

11. The cooling system of claim 1, wherein the cooling plates have surface structures at a side of the cooling plates open to the cavity for increasing the turbulence of fluid flowing in the cavity over the cooling plates.

12. A method of manufacturing a cooling system for molded modules, the method comprising:
providing a plurality of individual modules each comprising a semiconductor die encapsulated by a mold compound, a plurality of leads electrically connected to the semiconductor die and at least partly uncovered by the mold compound, and a cooling plate at least partly uncovered by the mold compound;
molding a plastic body onto a periphery of each individual module to form a multi-die module having a molded connection between the plastic body and the periphery of the individual modules without bolt or screw connections, with the leads of each individual module and the cooling plates being at least partly uncovered by the plastic body, wherein a portion of the plastic body occupies at least a portion of a gap between two adjacent ones of the individual modules; and
attaching a lid with a port to a periphery of the plastic body at a first side of the multi-die module, wherein a direct seal is formed between the lid and the multi-die module at the first side without O-rings so as to form a cavity between the lid and the plastic body for permitting fluid exiting or entering the port to contact the cooling plates of each individual module.

13. The method of claim 12, wherein each individual module has a pair of spaced apart cooling plates at opposing sides of the individual module with the semiconductor die interposed between the pair of cooling plates, wherein each pair of cooling plates is at least partly uncovered by the plastic body at opposing first and second sides of the multi-die module, and wherein each pair of cooling plates is open to the cavity.

14. The method of claim 13, further comprising attaching a base plate to the periphery of the plastic body at the second side of the multi-die module, the base plate sealing the multi-die module at the second side of the multi-die module.

15. The method of claim 14, wherein the cavity comprises a first part between the lid and the plastic body and a second part between the base plate and the plastic body, and wherein the plastic body has an open passageway at opposing ends of the plastic body which connect the first and second parts of the cavity.

16. The method of claim 15, wherein the port of the lid is an inlet port configured to intake a fluid into the first and second parts of the cavity in parallel, and wherein the lid further has an outlet port at the same side as the inlet port configured to exhaust the fluid from the first and second parts of the cavity in parallel.

17. The method of claim 13, further comprising attaching an additional lid to the periphery of the plastic body at the second side of the multi-die module, the additional lid sealing the multi-die module at the second side of the multi-die module, wherein the port of the lid is configured to intake a fluid into the cavity, and wherein the additional lid has an outlet port configured to exhaust the fluid from the cavity.

18. The method of claim 14, wherein the lid and the base plate each comprise plastic, and wherein attaching the lid to the periphery of the plastic body at the first side of the multi-die module and attaching the base plate to the periphery of the plastic body at the second side of the multi-die module comprises:
positioning the base plate on a support base so that openings in the base plate align with corresponding posts of the support base;
positioning the plastic body on the base plate so that openings in the plastic body align with the posts of the support base;
positioning the lid on the plastic body so that openings in the lid align with the posts of the support base;
plastic welding the lid to the periphery of the plastic body at the first side of the multi-die module; and
plastic welding the base plate to the periphery of the plastic body at the second side of the multi-die module.

19. The method of claim 12, wherein the lid is a plastic lid and attaching the lid to the periphery of the plastic body comprises plastic welding the plastic lid to the periphery of the plastic body to seal the multi-die module at the first side of the multi-die module and form the cavity between the lid and the plastic body.

20. The method of claim 12, wherein attaching the lid to the periphery of the plastic body comprises over-molding the lid to the periphery of the plastic body to seal the multi-die module at the first side of the multi-die module and form the cavity between the lid and the plastic body.

21. The method of claim 12, wherein attaching the lid to the periphery of the plastic body comprises gluing the lid to the periphery of the plastic body to seal the multi-die module at the first side of the multi-die module and form the cavity between the lid and the plastic body.

* * * * *